United States Patent [19]
Luich

[11] Patent Number: 5,824,577
[45] Date of Patent: Oct. 20, 1998

[54] MOSFET WITH REDUCED LEAKAGE CURRENT

[75] Inventor: Thomas Luich, Puyallup, Wash.

[73] Assignee: National Semiconductor Corporation, Santa Clara, Calif.

[21] Appl. No.: 448,798

[22] Filed: May 24, 1995

Related U.S. Application Data

[62] Division of Ser. No. 389,720, Feb. 16, 1995, abandoned.

[51] Int. Cl.[6] .............................................. H01L 21/8238
[52] U.S. Cl. .......................... 438/233; 438/230; 438/213; 438/227; 438/218
[58] Field of Search ............................... 437/192, 44, 31; 438/197, 199, 202, 218, 233, 227, 230, 213

[56] References Cited

U.S. PATENT DOCUMENTS

| | | | |
|---|---|---|---|
| 4,714,685 | 12/1987 | Schubert | 437/41 |
| 4,734,382 | 3/1988 | Krishna | 437/31 |
| 4,849,344 | 7/1989 | Desbiens et al. | 437/31 |
| 5,107,321 | 4/1992 | Iiderem et al. | 357/43 |
| 5,124,775 | 6/1992 | Iranmanesh | 357/43 |
| 5,219,784 | 6/1993 | Solheim | 437/57 |
| 5,231,042 | 7/1993 | Ilderem et al. | 437/44 |
| 5,234,847 | 8/1993 | Iranmanesh | 437/31 |
| 5,298,440 | 3/1994 | Jerome et al. | 437/192 |
| 5,314,832 | 5/1994 | Deleonibus | 437/27 |
| 5,338,694 | 8/1994 | Iiderem et al. | 437/31 |

FOREIGN PATENT DOCUMENTS

| | | | |
|---|---|---|---|
| 0 420 748 A1 | 4/1991 | European Pat. Off. | H01L 21/336 |
| 0 422 824 A1 | 4/1991 | European Pat. Off. | H01L 21/336 |
| 0 480 446 A3 | 4/1992 | European Pat. Off. | H01L 21/336 |

OTHER PUBLICATIONS

Chi Chang, et al., "Corner–Field Induced Drain Leakage in Thin Oxide MOSFETs," IEEE 1987, pp. 714–717.

T.Y. Chan, et al., "The Impact of Gate–Induced Drain Leakage Current on MOSFET Scaling," IEEE 1987, pp.718–721.

Primary Examiner—Trung Dang
Attorney, Agent, or Firm—Limbach & Limbach L.L.P.

[57] ABSTRACT

A metal-oxide-semiconductor field effect transistor (MOSFET) with reduced leakage current includes drain and source regions separated by a channel, a drain terminal over a portion of the drain region, a source terminal over a portion of the source region and a gate terminal opposite the channel. An oxide layer is deposited over the remaining portions of the drain and source regions, as well as on the adjacent vertical sides and top edges of the drain, source and gate terminals. A silicide layer is deposited over the gate terminal between the oxide-covered top edges thereof and over the drain and source terminal up to the oxide-covered top edges thereof. With oxide over the drain source regions instead of silicide, parasitic Schottky diodes are avoided, thereby eliminating leakage current due to such parasitic elements. Additionally, the oxide layer over the drain and source regions blocks pldd and nldd diffusions, thereby preventing impingement of the drain and source regions under the gate and adjacent oxide spacers and thereby significantly reducing leakage current due to band-to-band tunneling.

6 Claims, 6 Drawing Sheets

MOSFET WITH REDUCED LEAKAGE CURRENT

This is a divisional of application Ser. No. 08/389,720, filed Feb. 16, 1995.

BACKGROUND OF THE INVENTION

1. Field of the Invention

The present invention relates to integrated circuits with metal oxide semiconductor field effect transistors (MOSFETs), and in particular, to MOSFETs with reduced leakage current.

2. Description of the Related Art

Integrated circuits (ICs) containing digital, short channel, silicided complementary metal oxide semiconductor (CMOS) and combination bipolar and CMOS (BiCMOS) transistors are seeing increasing use in linear applications. However, whereas digital applications tend to be forgiving with respect to slight variations in voltage levels and charge accumulation or leakage, many linear applications have much more stringent requirements.

One linear application in particular which has stringent device requirements is a charge pump for phase lock loop (PLL) circuits. A charge pump requires extremely low leakage since the frequency of the voltage controlled oscillator (VCO) that it drives will vary as leakage causes charging or discharging of the control capacitor between the charge pump and the VCO input. Leakage problems are exacerbated by the fact that the charge pump output components driving the VCO are typically large because of drive, output resistance, operating range and margin requirements. It is becoming increasingly common for leakage current limits to be less than one nanoampere, with total output device widths of 6000 microns (3600 microns for PMOS plus 2400 microns for NMOS). (Further discussion of such charge pump circuits can be found in copending, commonly assigned U.S. patent application Ser. No. 08/335,091, filed Nov. 7, 1994, and entitled "Cascode Switched Charge Pump Circuit", the disclosure of which is incorporated herein by reference.)

Referring to FIG. 1, a cross section of a conventional BiCMOS IC using short channel, contactless, silicided devices is shown. This cross sectional view depicts resistors and bipolar, PMOS and NMOS transistors up through the silicidation step in process flow. It can be seen that both the polysilicon and single crystal silicon are silicided. As is well known, the silicide (e.g. titanium silicide, $TiSi_2$) reduces the resistance of the polysilicon gate and single crystal silicon source and drain (e.g. to approximately two ohms per square).

However, whereas the reduced polysilicon and single crystal silicon resistance due to the silicide is generally desirable, such silicidation introduces a problem to which some linear applications are particularly sensitive. Where the silicide overlays the P-type source and drain regions, parasitic Schottky diodes are formed in those areas where the source or drain has been consumed by the silicide. These parasitic Schottky diodes which are formed are of the field plate type, due to field oxide walling, and are known to be high leakage devices. Further, an additional problem, albeit somewhat unrelated to the silicide per se, is drain-to-well leakage due to band-to-band tunneling caused by impingement of the source and drain regions under the gate oxide and oxide spacer edges.

Accordingly, it would be desirable to have a digital, short channel CMOS or BiCMOS IC having the advantages of silicided polysilicon while also having significantly reduced leakage currents compatible with the stringent device requirements of many linear applications.

SUMMARY OF THE INVENTION

In accordance with the present invention, a MOSFET with reduced leakage current can be realized which avoids the creation of parasitic Schottky diodes, thereby eliminating leakage current due to such parasitic elements, and further by blocking p+ s/d and n+ s/d diffusions into the drain and source regions, thereby preventing impingement of the drain and source regions under the gate and adjacent component spacers and thereby significantly reducing leakage current due to band-to-band tunneling.

A MOSFET with reduced leakage current in accordance with one embodiment of the present invention includes a semiconductor substrate with drain and source regions separated by a channel, a drain terminal over a portion of the drain region, a source terminal over a portion of the source region and a gate terminal opposite the channel. A first silicide layer is on the drain terminal, a first nonsilicide, e.g. oxide, layer covers another portion of the drain region and a second silicide layer is on the gate terminal.

In one preferred embodiment of a MOSFET with reduced leakage current in accordance with the present invention, a second nonsilicide, e.g. oxide, layer covers another portion of the source region. In another preferred embodiment, the silicide layers over the drain and gate terminals are narrower than the drain and gate terminals and do not extend to at least one of the edges thereof. In yet another preferred embodiment, the source terminal has a third silicide layer which is narrower than the source terminal and does not extend to at least one of the edges thereof.

These and other features and advantages of the present invention will be understood upon consideration of the following detailed description of the invention and the accompanying drawings.

DETAILED DESCRIPTION OF THE INVENTION

Figure 1:
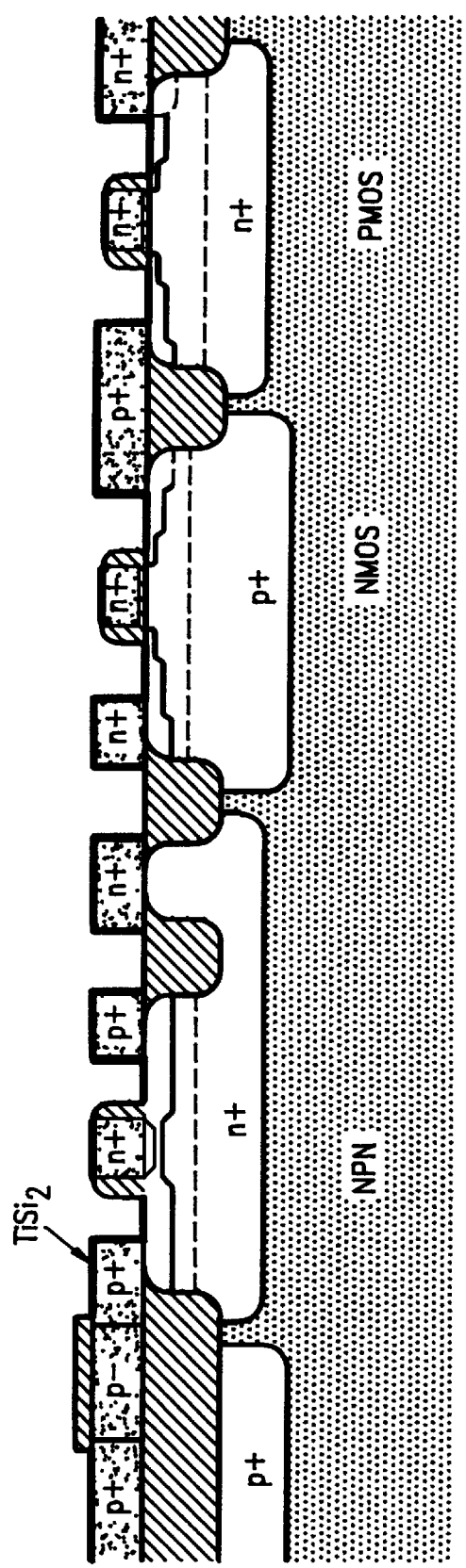
FIG. 1 is a cross sectional view of a portion of a conventional BiCMOS IC.
Figure 2:
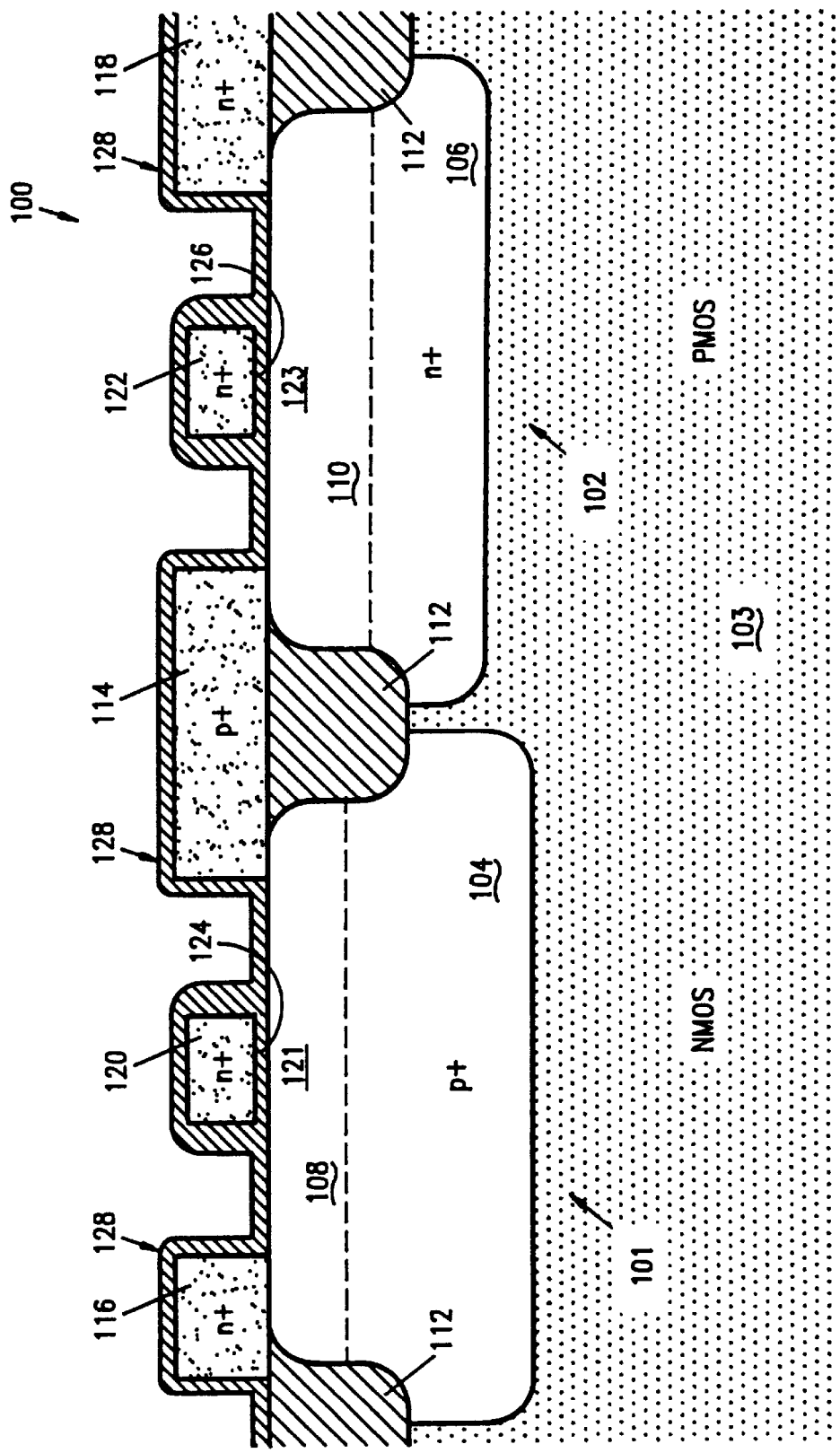
FIG. 2 is a cross sectional view of a portion of a BiCMOS IC with complementary MOSFETs in accordance with one embodiment of the present invention up to the oxidation step in the process flow.

Referring to FIG. 2, a cross section of a portion 100 of a BiCMOS IC with complementary MOSFETs 101, 102 in accordance with one embodiment of the present invention is shown at the oxidation step in the process flow. (In a preferred embodiment of the present invention, the process flow is as disclosed in the following U.S. Patents, the disclosures of which are incorporated herein by reference: U.S. Pat. Nos. 4,727,046; 5,079,182; 5,081,518; 5,082,796; 5,107,321; 5,219,784; 5,338,694; and 5,338,696.) The substrate 103 has had the P+ and N+ tubs implanted for the NMOS and PMOS devices, respectively. The P-type lightly doped diffusion (pldd) 108 and N-type lightly doped diffusion (nldd) 110 are in place within the P+ 104 and N+ 106 tubs, respectively. Surrounding these tubs 104, 106, are oxide spacers 112. Forming the drain terminals is a deposit of P+ polysilicon 114. Forming the source terminals are deposits of N+ polysilicon 116, 118. Forming the gate terminals are deposits of N+ polysilicon 120, 122 separated by gate oxides 124, 126 from the channels 121, 123 within the pldd 108 and nldd 110 regions. Deposited over all of these elements is a layer of oxide 128 (e.g. silicon dioxide, $SiO_2$).

Figure 3:
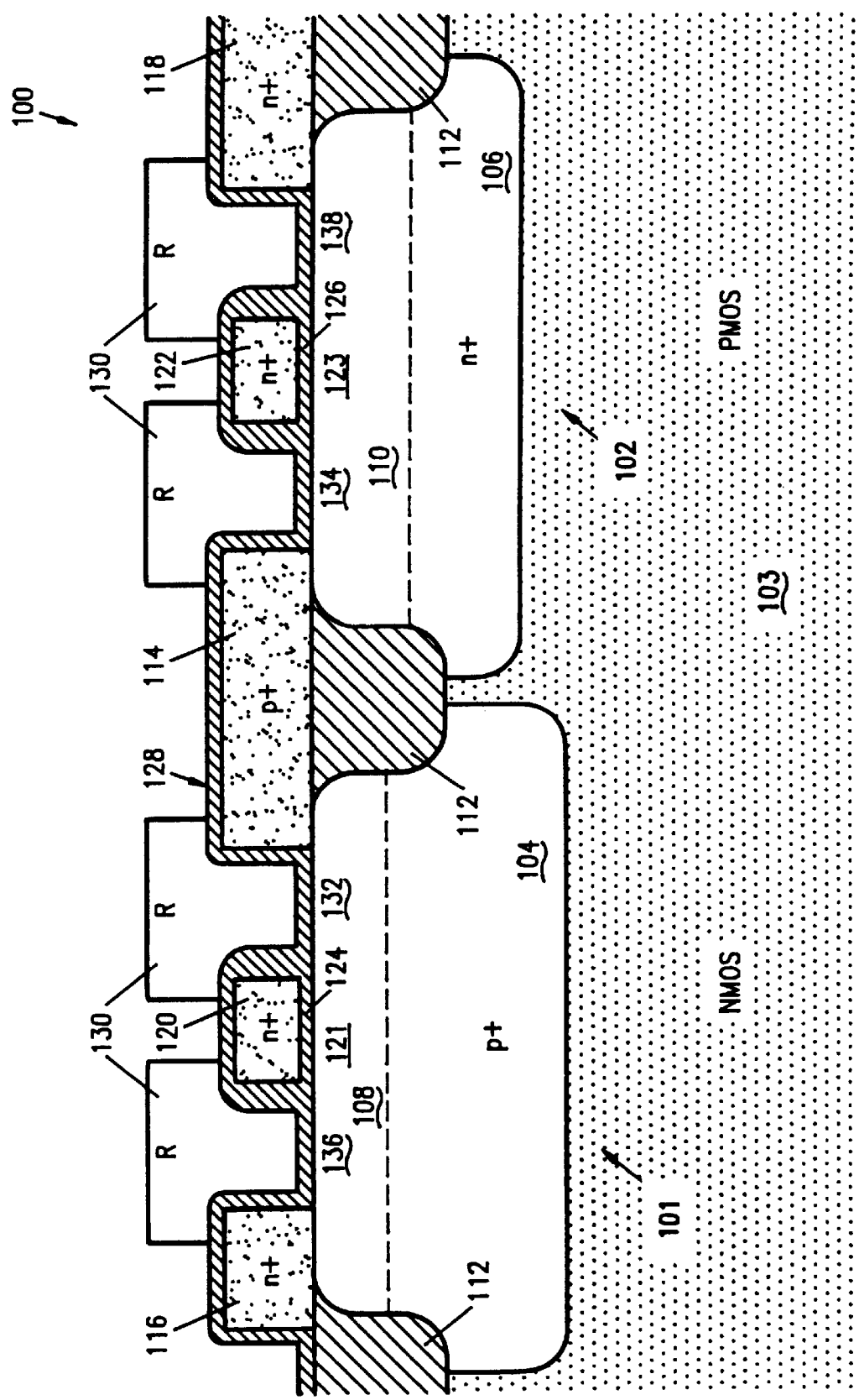
FIG. 3 illustrates the IC of FIG. 2 following the depositing of resist material.

Referring to FIG. 3, the next step is to deposit resist material 130 over the drain regions 132, 134 and source regions 136, 138 of the NMOS 101 and PMOS 102 devices.

Figure 4:
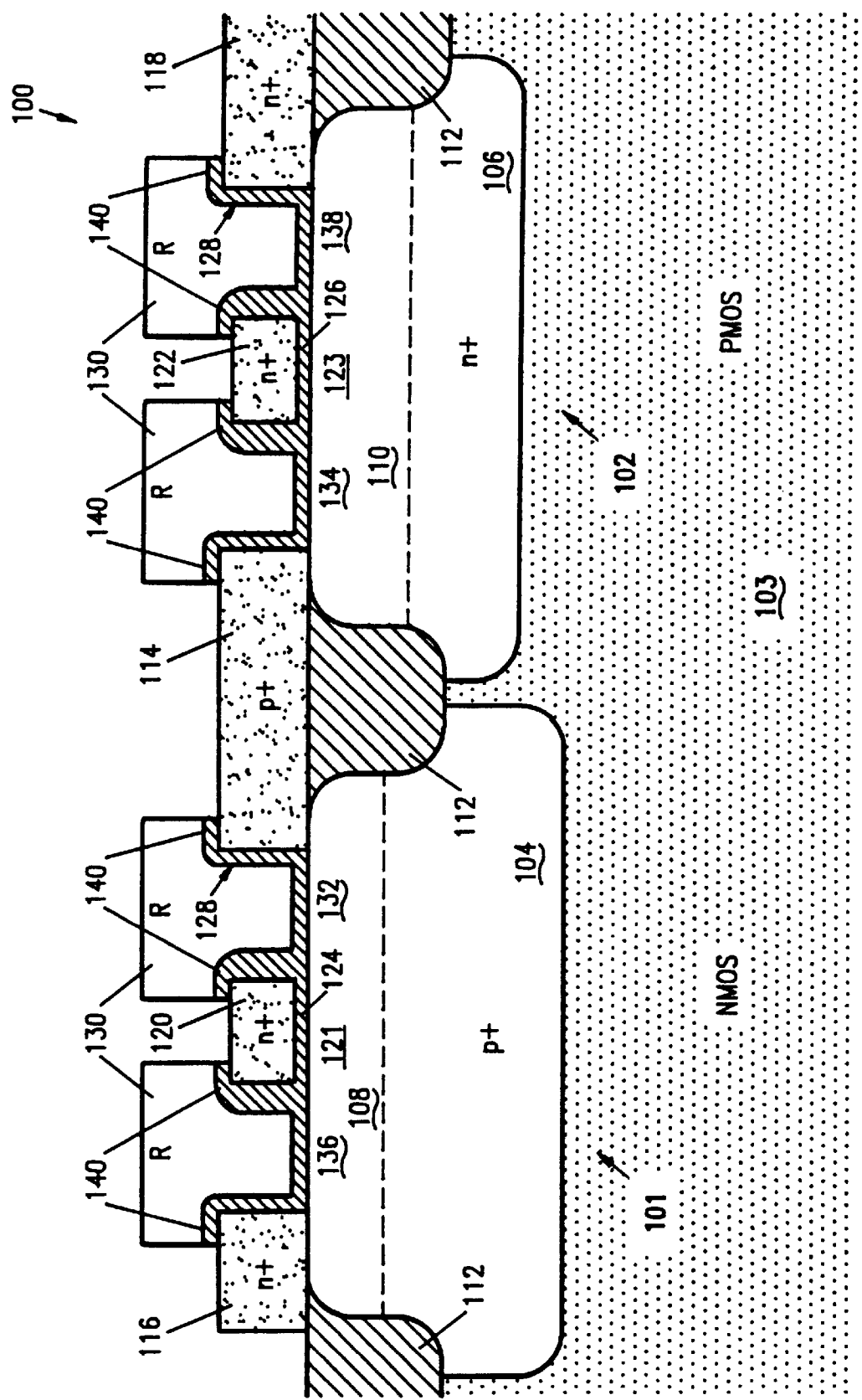
FIG. 4 illustrates the IC of FIG. 3 following the removal of exposed oxide.

Referring to FIG. 4, the next step is to remove the oxidation 128 areas overlaying much of the polysilicon 114, 116, 118 forming the gate source and drain terminals, as well as over some of the spacer oxide 112. However, portions 140 of the oxide material 128 are left overlapping the top edges of the polysilicon 114, 116, 118. In a preferred embodiment of the present invention, this overlap is approximately one-half micron wide (e.g. for a two micron channel).

Figure 5:
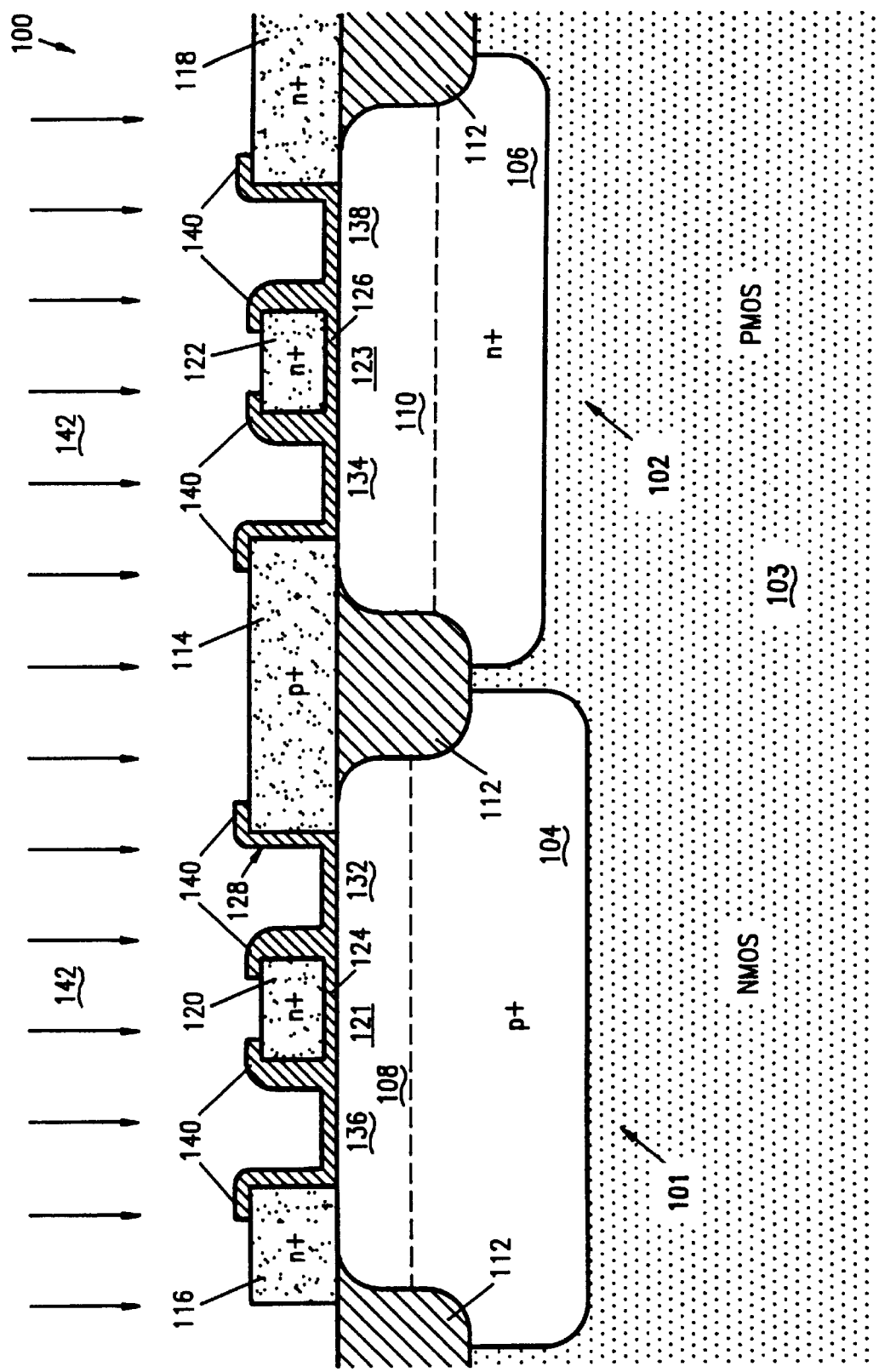
FIG. 5 illustrates the IC of FIG. 4 during the implantation step following the removal of the resist material.

Referring to FIG. 5, the resist material 130 (FIG. 4) is removed and the normal source/drain implantation 142 is performed. However, due to the presence of the remaining oxide 128, no additional source/drain implantation takes place within the drain 132, 134 and source 136, 138 regions of the pldd 108 and nldd 110 areas of these MOSFETs 101, 102. As should be recognized, this advantageously prevents impingement of source/drain implants beneath the gate oxides 124, 126 and edges of the oxide spacers 112. Accordingly, leakage due to band-to-band tunneling is significantly reduced, if not eliminated.

Figure 6:
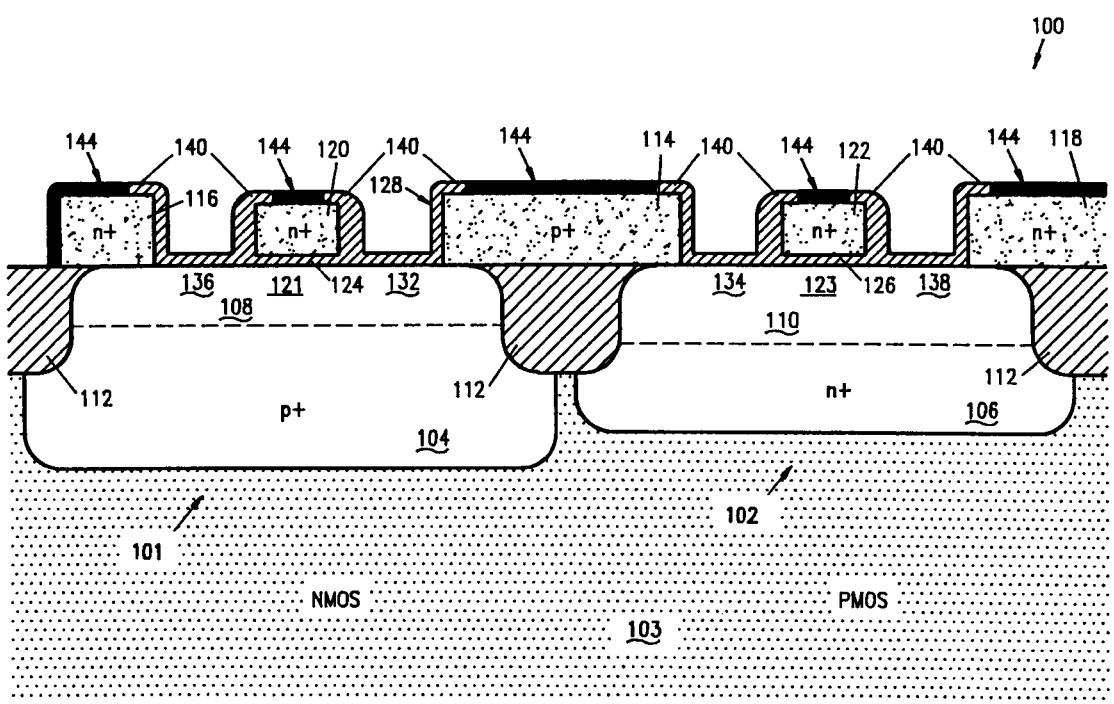
FIG. 6 is a cross sectional view of a portion of a BiCMOS IC with complementary MOSFETs having nested silicide atop the polysilicon gate, source and drain terminals in accordance with one embodiment of the present invention.

Referring to FIG. 6, the next step is to deposit the silicide 144 atop the polysilicon 114, 116, 118, 120, 122 adjacent and between the ends 140 of the remaining oxide 128.

Alternatively, in accordance with the foregoing discussion, MOSFETs in accordance with the present invention can be optimized as desired by removing the oxide 128 from and allowing silicide 144 to form over the source regions which are intended to be grounded within the circuit.

From the foregoing, a number of advantages of a MOSFET in accordance with the present invention should be evident. For example, by retaining regions of silicide 144 nested within the oxide 128, reduced polysilicon resistance is maintained. Further, by preventing formation of silicide on the surfaces of the single crystal silicon, i.e. those areas overlying the drain 132, 134 and source 136, 138 regions, no parasitic Schottky diodes are formed, thereby eliminating leakage components due to such elements. Further still, by retaining the oxide 128 over the drain 132, 134 and source 136, 138 regions and thereby blocking the source/drain implantation, impingement of source/drain implants is prevented from occurring beneath the gate oxides 124, 126 and edges of the spacer oxides 112, thereby significantly reducing, if not eliminating, leakage due to band-to-band tunneling. Moreover, only mask changes are needed for fabricating MOSFETs in accordance with the present invention, i.e. no material changes in the process flow per se are required.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A method of fabricating an integrated circuit including a metal-oxide-semiconductor field effect transistor (MOSFET) with reduced leakage current, said method comprising the steps of:

providing an integrated MOSFET which includes:
a drain region;
a drain terminal connected to a first portion of said drain region, wherein said drain terminal includes opposing sides and opposing edges;
a source region;
a source terminal connected to a first portion of said source region, wherein said source terminal includes opposing sides and opposing edges;
a channel region between said drain and source regions;
a gate terminal disposed opposite said channel, wherein said gate terminal includes opposing sides and opposing edges;
depositing a nonsilicide layer on a second portion of said drain region; and
depositing a silicide layer on said drain terminal and on said gate terminal, wherein said silicide layer on said drain terminal is narrower than said drain terminal.

2. A method of fabricating an integrated circuit including a metal-oxide-semiconductor field effect transistor (MOSFET) with reduced leakage current, said method comprising the steps of:

providing an integrated MOSFET which includes:
a drain region;
a drain terminal connected to a first portion of said drain region, wherein said drain terminal includes opposing sides and opposing edges;
a source region;
a source terminal connected to a first portion of said source region, wherein said source terminal includes opposing sides and opposing edges;
a channel region between said drain and source regions;
a gate terminal disposed opposite said channel, wherein said gate terminal includes opposing sides and opposing edges;
depositing a nonsilicide layer on a second portion of said drain region; and
depositing a silicide layer on said drain terminal and on said gate terminal, wherein said silicide layer on said gate terminal is narrower than said gate terminal.

3. A method of fabricating an integrated circuit including a metal-oxide-semiconductor field effect transistor (MOSFET) with reduced leakage current, said method comprising the steps of:

providing an integrated MOSFET which includes:

a drain region;

a drain terminal connected to a first portion of said drain region, wherein said drain terminal includes opposing sides and opposing edges;

a source region;

a source terminal connected to a first portion of said source region, wherein said source terminal includes opposing sides and opposing edges;

a channel region between said drain and source regions;

a gate terminal disposed opposite said channel, wherein said gate terminal includes opposing sides and opposing edges;

depositing a nonsilicide layer on a second portion of said drain region; and depositing a silicide layer on said drain terminal, said gate terminal and said source terminal, wherein said silicide layer on said source terminal is narrower than said source terminal.

4. A method as recited in claim 1, wherein said step of depositing a silicide layer which is narrower than said drain terminal comprises depositing a silicide layer between said opposing drain terminal edges without extending to one thereof.

5. A method as recited in claim 2, wherein said step of depositing a silicide layer which is narrower than said gate terminal comprises depositing a silicide layer between said opposing gate terminal edges without extending to one thereof.

6. A method as recited in claim 3, wherein said step of depositing a silicide layer which is narrower than said source terminal comprises depositing a silicide layer between said opposing source terminal edges without extending to one thereof.

\* \* \* \* \*